(12) United States Patent
Pham et al.

(10) Patent No.: US 10,088,854 B2
(45) Date of Patent: Oct. 2, 2018

(54) MODULATING JITTER FREQUENCY AS SWITCHING FREQUENCY APPROACHES JITTER FREQUENCY

(71) Applicant: Power Integrations, Inc., San Jose, CA (US)

(72) Inventors: Giao Minh Pham, Milpitas, CA (US); Lance M. Wong, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 15/631,998

(22) Filed: Jun. 23, 2017

(65) Prior Publication Data

US 2018/0074531 A1 Mar. 15, 2018

Related U.S. Application Data

(60) Provisional application No. 62/395,942, filed on Sep. 16, 2016.

(51) Int. Cl.
| | | |
|---|---|---|
| *H03D 3/24* | (2006.01) | |
| *G05F 1/46* | (2006.01) | |
| *G01R 31/317* | (2006.01) | |
| *H03L 7/187* | (2006.01) | |
| *H02M 3/335* | (2006.01) | |
| *G01R 31/28* | (2006.01) | |
| *G01R 29/26* | (2006.01) | |
| *H02M 1/44* | (2007.01) | |

(Continued)

(52) U.S. Cl.
CPC ............... *G05F 1/46* (2013.01); *G01R 29/26* (2013.01); *G01R 31/2841* (2013.01); *G01R 31/31709* (2013.01); *G02F 1/3515* (2013.01); *H02M 1/44* (2013.01); *H02M 3/33507* (2013.01); *H03L 7/187* (2013.01); *H02M 2001/0025* (2013.01)

(58) Field of Classification Search
CPC ..... H04L 7/033; H02M 3/33515; H02W 1/44; H02W 1/143; H03L 7/0891; H03L 7/093
USPC ......... 375/376, 354; 323/205, 222, 282, 285
See application file for complete search history.

(56) References Cited

U.S. PATENT DOCUMENTS

| 6,249,876 B1 | 6/2001 | Balakrishnan et al. |
|---|---|---|
| 8,970,260 B1 | 3/2015 | de Haas |

(Continued)

OTHER PUBLICATIONS

Giao Minh Pham et al., "Switched Mode Power Converter Controller with Ramp Time Modulation with Jitter Frequency," U.S. Appl. No. 15/408,714, filed Jan. 18, 2017.

(Continued)

*Primary Examiner* — Khai Tran
(74) *Attorney, Agent, or Firm* — Christensen O'Connor Johnson Kindness PLLC

(57) ABSTRACT

A controller for use in a power converter includes a jitter generator circuit coupled to receive a drive signal from a switch controller and generate a jitter signal. The switch controller is coupled to a power switch coupled to an energy transfer element. The switch controller is coupled to receive a current sense signal representative of a drain current through the power switch. The switch controller is coupled to generate the drive signal to control switching of the power switch in response to the current sense signal and the jitter signal to control a transfer of energy from an input of the power converter to an output of the power converter.

22 Claims, 7 Drawing Sheets

(51) Int. Cl.
*G02F 1/35* (2006.01)
*H02M 1/00* (2006.01)

(56) References Cited

U.S. PATENT DOCUMENTS

| | | | |
|---|---|---|---|
| 9,036,377 B2* | 5/2015 | Chang ................ | H02M 1/36 |
| | | | 323/282 |
| 9,077,249 B2* | 7/2015 | Tsou ................ | H02M 3/33507 |
| 9,450,478 B1 | 9/2016 | Djenguerian et al. | |
| 9,774,248 B2* | 9/2017 | Saint-Pierre ............ | H02M 1/44 |
| 2011/0175584 A1 | 7/2011 | Huber et al. | |
| 2012/0194227 A1 | 8/2012 | Lin et al. | |
| 2012/0300499 A1 | 11/2012 | Chang et al. | |
| 2013/0106379 A1* | 5/2013 | Morrish ................ | H02M 1/44 |
| | | | 323/282 |
| 2013/0182469 A1 | 7/2013 | Chiang | |
| 2014/0085936 A1* | 3/2014 | Jin ................ | H02M 1/44 |
| | | | 363/16 |
| 2015/0280659 A1 | 10/2015 | Yuan et al. | |
| 2016/0134186 A1 | 5/2016 | Saint-Pierre et al. | |
| 2017/0085185 A1 | 3/2017 | Wang | |

OTHER PUBLICATIONS

European Patent Application No. 17191404.7—Extended European Search Report dated Feb. 23, 2018, 9 pages.

\* cited by examiner

MODULATING JITTER FREQUENCY AS SWITCHING FREQUENCY APPROACHES JITTER FREQUENCY

CROSS-REFERENCE TO RELATED APPLICATIONS

This application claims priority under 35 U.S.C. 119(e) to U.S. Provisional Application No. 62/395,942, filed on Sep. 16, 2016, which is incorporated herein by reference in its entirety.

BACKGROUND INFORMATION

Field of the Disclosure

The present invention relates generally to power converters, and more specifically the modulation of a jitter signal in a controller.

Background

Electronic devices (such as cell phones, tablets, laptops, etc.) use power to operate. Switched mode power converters are commonly used due to their high efficiency, small size, and low weight to power many of today's electronics. Conventional wall sockets provide a high voltage alternating current. In a switching power converter, a high voltage alternating current (ac) input is converted to provide a well-regulated direct current (dc) output through an energy transfer element to a load. In operation, a switch is turned ON and OFF to provide the desired output by varying the duty cycle (typically the ratio of the on time of the switch to the total switching period), varying the switching frequency, or varying the number of on/off pulses per unit time of the switch in a switched mode power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
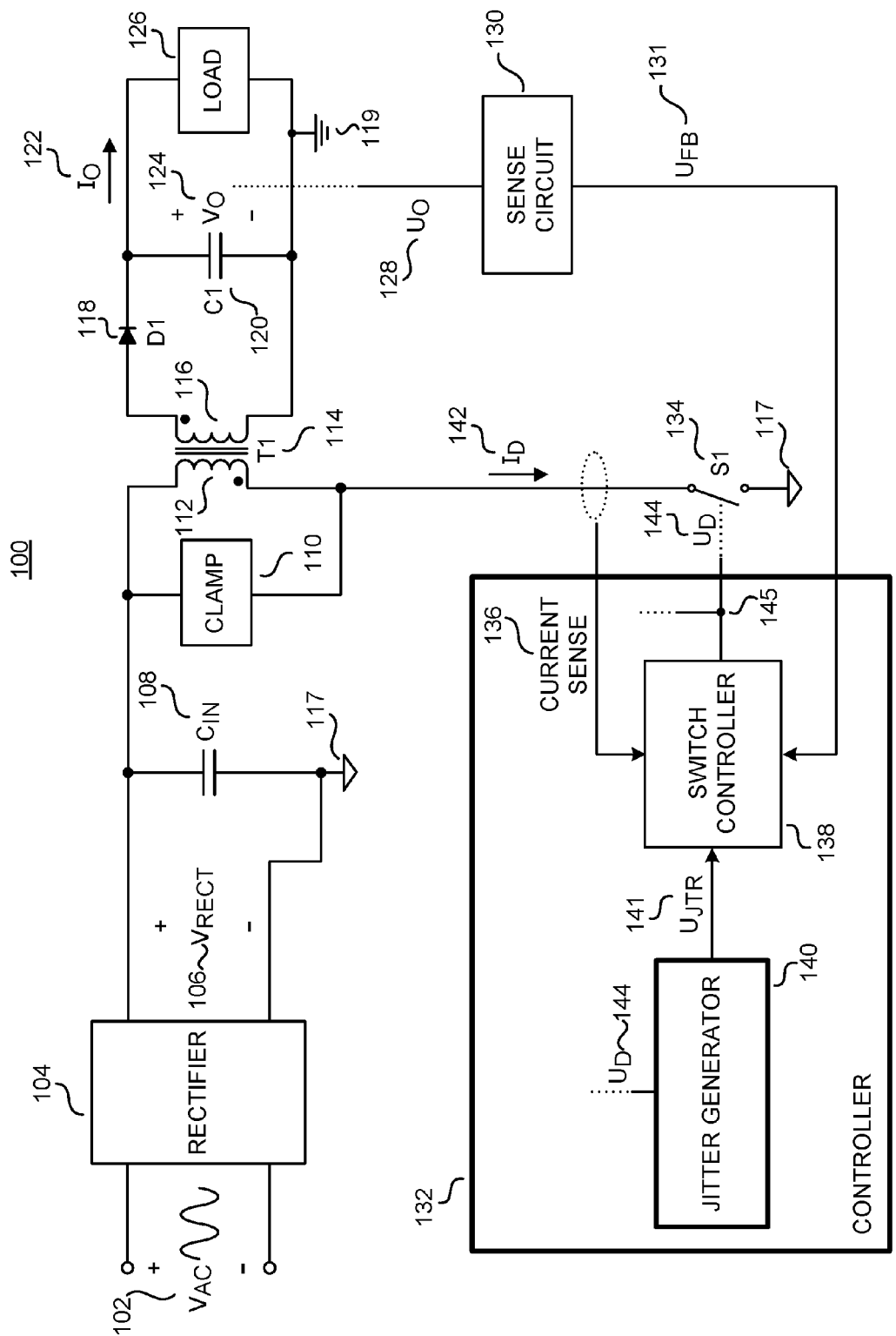
FIG. 1 is a schematic illustrating a power converter with a switch controller and jitter generator in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples power converter including a controller with a switch controller with a jitter generator are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

To illustrate, FIG. 1 shows a functional block diagram of an example power converter 100 is illustrated including ac input voltage $V_{AC}$ 102, a rectifier 104, a rectified voltage $V_{RECT}$ 106, an input capacitor $C_{IN}$ 108, a clamp circuit 110, an energy transfer element T1 114, a primary winding 112 of the energy transfer element T1 114, a secondary winding 116 of the energy transfer element T1 114, a power switch S1 134, input return 117, a rectifier D1 118, an output return 119, an output capacitor C1 120, a load 126, a sense circuit 130, and a controller 132. FIG. 1 further illustrates an output voltage $V_O$ 124, an output current $I_O$ 122, an output quantity $U_O$ 128, a feedback signal $U_{FB}$ 131, a current sense signal 136, and a drain current $I_D$ 142. Controller 132 further includes a switch controller 138 and a jitter generator 140, and a node 145. Furthermore, controller 132 further includes a jitter signal $U_{JTR}$ 141, and a drive signal 144.

The example switched mode power converter 100 illustrated in FIG. 1 is coupled in a flyback configuration, which is just one example of a switched mode power converter that may benefit from the teachings of the present invention. It is appreciated that other known topologies and configurations of switched mode power converters may also benefit from the teachings of the present invention. In addition, the example power converter shown in FIG. 1 is an isolated power converter. It should be appreciated that non-isolated power converters may also benefit from the teachings of the present invention.

The power converter 100 provides output power to the load 126 from an unregulated input voltage. In one embodiment, the input voltage is the ac input voltage $V_{AC}$ 102. In another embodiment, the input voltage is a rectified ac input voltage such as rectified voltage $V_{RECT}$ 106. The rectifier 104 outputs rectified voltage $V_{RECT}$ 106. In one embodiment, rectifier 104 may be a bridge rectifier. The rectifier 104 further couples to the energy transfer element T1 114. In some embodiments of the present invention, the energy transfer element T1 114 may be a coupled inductor. In other embodiments, the energy transfer element T1 114 may be a transformer. In a further example, the energy transfer element T1 114 may be an inductor. In the example of FIG. 1, the energy transfer element T1 114 includes two windings, a primary winding 112 and a secondary winding 116. However, it should be appreciated that the energy transfer element T1 114 may have more than two windings. In the example of FIG. 1, primary winding 112 may be considered an input winding, and secondary winding 116 may be considered an output winding. The primary winding 112 is further coupled to power switch S1 134, which is then further coupled to input return 117.

In addition, the clamp circuit 110 is illustrated in the example of FIG. 1 as being coupled across the primary winding 112 of the energy transfer element T1 114. The input capacitor $C_{IN}$ 108 may be coupled across the primary winding 112 and power switch S1 134. In other words, the input capacitor $C_{IN}$ 108 may be coupled to the rectifier 104 and input return 117.

Secondary winding 116 of the energy transfer element T1 114 is coupled to the rectifier D1 118. In the example of FIG. 1, the rectifier D1 118 is exemplified as a diode. Both the output capacitor C1 120 and the load 126 are shown in FIG. 1 as being coupled to the rectifier D1 118. An output is provided to the load 126 and may be provided as either a regulated output voltage $V_O$ 124, regulated output current $I_O$ 122, or a combination of the two.

The power converter 100 further comprises circuitry to regulate the output, which is exemplified as output quantity $U_O$ 128. In general, the output quantity $U_O$ 128 is either an output voltage $V_O$ 124, an output current $I_O$ 122, or a combination of the two. A sense circuit 130 is coupled to sense the output quantity $U_O$ 128 and to provide feedback signal $U_{FB}$ 131, which is representative of the output quantity $U_O$ 128. Feedback signal $U_{FB}$ 131 may be a voltage signal or a current signal. In one example, the sense circuit 130 may sense the output quantity $U_O$ 128 from an additional winding included in the energy transfer element T1 114.

In another example, there may be a galvanic isolation (not shown) between the controller 132 and the sense circuit 130. The galvanic isolation could be implemented by using devices such as an opto-coupler, a capacitor or a magnetic coupling. In a further example, the sense circuit 130 may utilize a voltage divider to sense the output quantity $U_O$ 128 from the output of the power converter 100.

Switch controller 138 is coupled to the sense circuit 130 and receives the feedback signal $U_{FB}$ 131 from the sense circuit 130. Switch controller 138 further includes terminals for receiving the current sense signal 136, and provides a drive signal $U_D$ 144 to power switch S1 134. The current sense signal 136 may be representative of the drain current ID 142 in the power switch S1 134. Current sense signal 136 may be a voltage signal or a current signal. In addition, switch controller 138 provides drive signal $U_D$ 144 to the power switch S1 134 to control various switching parameters to control the transfer of energy from the input of power converter 100 to the output of power converter 100. Examples of such parameters may include switching frequency, switching period, duty cycle, or respective ON and OFF times of the power switch S1 134. As shown in the depicted example, the jitter generator 140 is coupled to receive a drive signal $U_D$ 144 from the switch controller 138 and generate a jitter signal $U_{JTR}$ 141.

In operation, the jitter signal $U_{JTR}$ 141 is modulated as switching frequency approaches the jitter frequency. In one example, the modulation is a frequency modulation whereby the frequency of the jitter signal is changed, and the amplitude remains the same. Further explanation of how the jitter signal $U_{JTR}$ 141 is modulated will be explained in FIG. 2.

Figure 2:
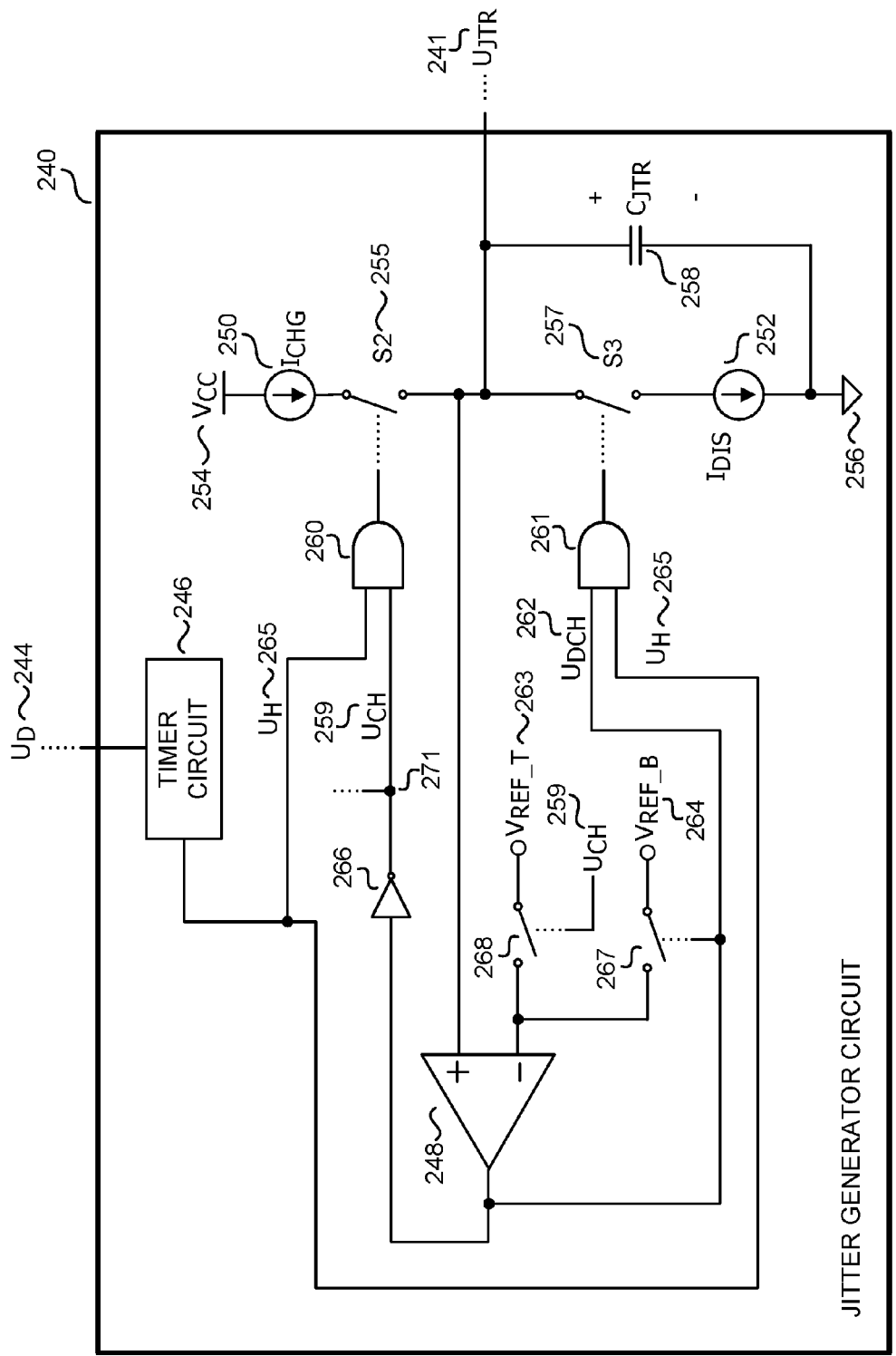
FIG. 2 is a schematic illustrating an example of a jitter generator circuit in accordance with the teachings of the present invention.

FIG. 2 is a schematic illustrating an example of a jitter generator circuit 240 in accordance with the teachings of the present invention. It is appreciated that jitter generator circuit 240 may be an example of jitter generator circuit 140 of FIG. 1, and that similarly named and numbered elements referenced below may therefore be coupled and function similar to as described above. The jitter generator circuit 240 is coupled to receive a drive signal $U_D$ 244 and output a jitter signal $U_{JTR}$ 241. The jitter generator circuit 240 includes a timer circuit 246, a comparator 248, current sources 250 and 252, a voltage supply $V_{CC}$ 254, a second switch S2 255, a third switch S3 257, a local return 256, a capacitor $C_{JTR}$ 258, a first logic gate 260, a second logic gate 261, an inverter 266, a fourth switch 267, and a fifth switch 268. FIG. 2 further includes a first voltage reference $V_{REF\_T}$ 263 and a second voltage reference $V_{REF\_B}$ 264.

Comparator 248 includes a first input coupled to one end of the capacitor $C_{JTR}$ 258, and a second input is coupled to a voltage reference. In one example, the voltage reference is a first voltage reference $V_{REF\_T}$ 263 or a second voltage reference $V_{REF\_B}$ 264. The value of the voltage reference is selected in response to the output of the comparator 248.

The jitter generator circuit 240 further includes a first logic gate 260 having a first input is coupled to an inverted output of the comparator 248, and a second input coupled to the hold signal $U_H$ 265 of the timer circuit 246. In one example, the hold signal $U_H$ 265 is an active low signal. The first logic gate 260 is coupled to activate or deactivate a second switch 255 coupled current source $IC_{HG}$ 250 to charge the capacitor $C_{JTR}$ 258. A second logic gate 261 having a first input is coupled to the output of the comparator 248, and a second input is coupled to the hold signal $U_H$ 265. The second logic gate 261 is coupled to activate or deactivate a third switch 257 coupled to current source $I_{DIS}$ 252 to discharge capacitor $C_{JTR}$ 258.

In operation, the comparator 248 determines if the jitter signal $U_{JTR}$ 241 is greater than either a first voltage reference $V_{REF\_T}$ 263 or a second voltage reference $V_{REF\_B}$ 264. The capacitor $C_{JTR}$ 258 is coupled to be charged by a first current source $I_{CHG}$ 250 if the jitter signal $U_{JTR}$ 241 is less than a first voltage reference $V_{REF\_T}$ 263, and the capacitor $C_{JTR}$ 258 is coupled to be discharged by a second current source $I_{DIS}$ 252 if the jitter signal $U_{JTR}$ 241 is greater than a second voltage reference $V_{REF\_B}$ 264. The hold signal $U_H$ 265 generated by timer circuit 265 is coupled to cease the charging of the capacitor $C_{JTR}$ 258 when a pulse of the drive signal $U_D$ 244 has been detected at a frequency below a defined threshold frequency $F_{TH}$, or cease the discharging of the capacitor $C_{JTR}$ 258 when a pulse of the drive signal $U_D$ 244 has been detected below a defined threshold frequency $F_{TH}$. A logic high of timer circuit 246 indicates the timer has not expired, while a logic low timer circuit indicates the timer has expired.

The discharge signal $U_{DCH}$ 262 is coupled to switch 267 to couple the second voltage reference to the inverting input of comparator 248. Furthermore, the discharge signal is coupled to an input of logic gate 261 that opens and closes the third switch S3 257 that discharges the capacitor $C_{JTR}$ 258. The timer circuit 246 is coupled to generate the hold signal $U_H$ 265 in response to the drive signal $U_D$ 244 to indicate whether a pulse of the drive signal $U_D$ 244 has been detected at a frequency below a first threshold frequency, which in one example can be known as a defined threshold frequency $F_{TH}$.

In addition, the discharge signal $U_{DCH}$ 248 is coupled to inverter 266 to generate a charge signal $U_{CH}$ 259. The charge signal $U_{CH}$ 259 is coupled to the switch 268, to couple the first voltage reference to the inverting input of comparator 248. The charge signal $U_{CH}$ 259 is coupled to an input of logic gate 260 that opens and closes the second switch S2 255 that charges the capacitor $C_{JTR}$ 258. When the jitter signal $U_{JTR}$ 241 is greater than a first voltage reference $V_{REF\_T}$ 263, the discharge signal $U_{DCH}$ 262 transitions to a logic high. The inverter 266 transitions the charge signal $U_{CH}$ 259 to a logic low, and logic gate 260 opens switch 255. The charge signal $U_{CH}$ 259 also opens the fifth switch 268. The discharge signal $U_{DCH}$ 262 closes the fourth switch 267 that is coupled to the second voltage reference $V_{REF\_B}$ 264. Logic gate 261 is coupled to receive the discharge signal $U_{DCH}$ 262 and the hold signal $U_H$ 265. The third switch 257 is closed in response to logic gate 261.

Figure 3:
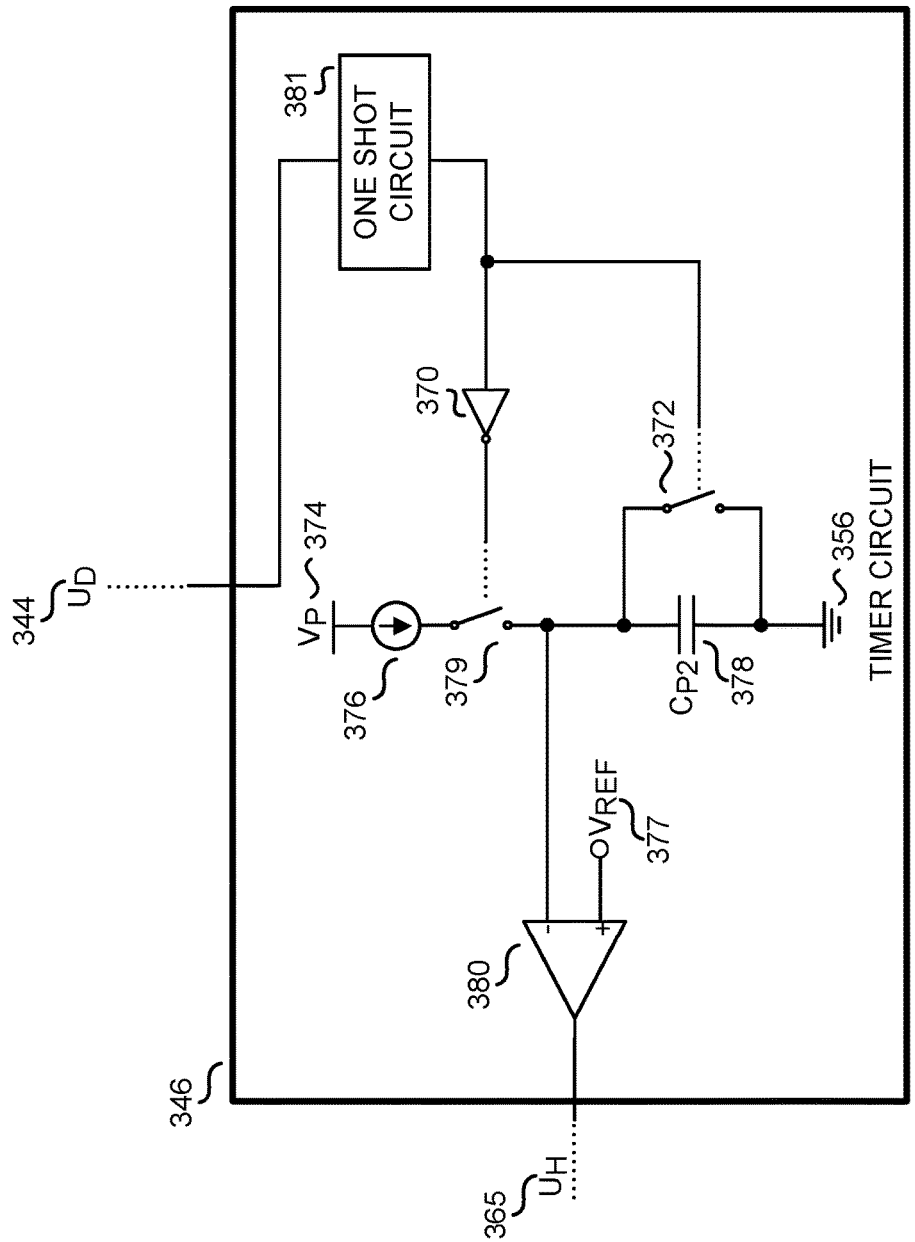
FIG. 3 is a schematic illustrating an example of a timer circuit in accordance with the teachings of the present invention.

FIG. 3 is a schematic illustrating an example of a timer circuit 346 in accordance with the teachings of the present invention. It is appreciated that timer circuit 346 may be an example of timer circuit 246 of FIG. 2, and that similarly named and numbered elements referenced below may therefore be coupled and function similar to as described above.

As shown in the example of FIG. 3, timer circuit 346 is coupled to generate a hold signal $U_H$ 365 in response to the drive signal $U_D$ 344 to indicate whether a pulse of the drive signal $U_D$ 344 has been detected at a frequency below the defined threshold frequency $F_{TH}$. Timer circuit 346 includes a local return 356, an inverter 370, a switch 372, a voltage potential $V_P$ 374, a current source 376, a capacitor $C_{P2}$ 378, a switch 379, a comparator 380, and a one shot circuit 381.

One input of the comparator 380 is coupled to one end of capacitor $C_{P2}$ 378, and the other input of comparator 380 is coupled to a voltage reference $V_{REF}$ 377. In the beginning of every switching cycle, the capacitor $C_{P2}$ 378 is completely discharged.

In operation, the one shot circuit 381 is coupled to receive the drive signal $U_D$ 344. The output of the one-shot circuit 381 is coupled to inverter 370, which opens and closes switch 379. When the switch 379 is OFF, switch 372 is ON and the capacitor $C_{P2}$ 378 is discharged to local return 356. The capacitor $C_{P2}$ 378 should be completely discharged prior to switch 379 turning ON. When switch 379 is ON and switch 372 is OFF, current source 376 with a voltage potential $V_P$ 374 charges the capacitor $C_{P2}$ 378. The size of capacitor $C_{P2}$ 378 and/or value of current source 376, and/or the value of voltage $V_{REF}$ 377 may be selected to a fixed time period $T_{FTH}$ that corresponds with the defined threshold frequency $F_{TH}$. The hold signal $U_H$ 365 transitions to a logic low when the voltage of the capacitor $C_{P2}$ 378 exceeds a voltage reference $V_{REF}$ 377.

In another example, timer circuit 346 can be implemented as a digital circuit instead of an analog circuit as described previously. The timer circuit 346 would include a digital counter with a clock input.

Figure 4:
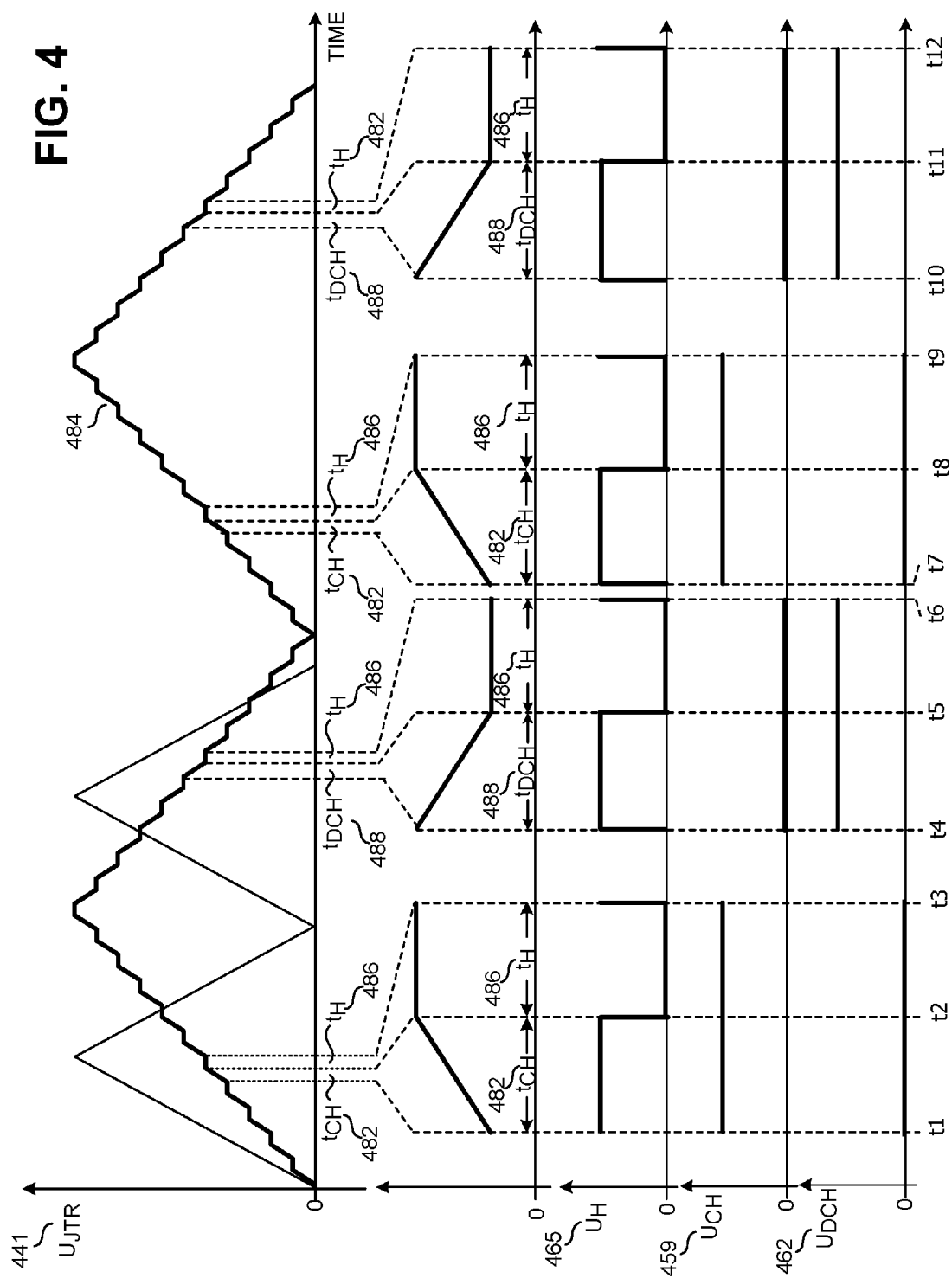
FIG. 4 is an example timing diagram illustrating one example of waveforms that show a jitter signal, a hold signal, a charge signal, and a discharge signal in accordance with the teachings of the present invention.

FIG. 4 is an example timing diagram illustrating one example of waveforms that show a jitter signal, a hold signal, a charge signal, and a discharge signal which may be found in the examples described above in accordance with the teachings of the present invention. The first timing diagram illustrates a jitter signal $U_{JTR}$ 441. The bold waveform in the first timing diagram illustrates a modulated jitter waveform 484. The second timing diagram illustrates a close up of the jitter signal $U_{JTR}$ 441 shown in the first timing diagram. The third timing illustrates the hold signal $U_H$ 465 generated by the jitter generator circuit. The fourth timing diagram illustrates the charge signal $U_{CH}$ 459. The fifth timing diagram illustrates the discharge signal $U_{DCH}$ 462.

In one example, the jitter signal waveform can be a triangle waveform. In other examples, the jitter signal waveform can be a sawtooth waveform. In a further example, the jitter signal waveform is a periodic waveform. In general, the modulated jitter signal has the same amplitude as the original jitter signal, and a slower frequency. The modulated jitter signal $U_{JTR}$ 441 can be used to adjust parameters such as variable current limit, frequency, on time $T_{ON}$, and off time $T_{OFF}$. During time t1 to time t2, the jitter generator generates a jitter signal with a positive slope as seen in the timing diagram for a charge time $t_{CH}$ 482. The timer circuit generates a logic high for hold signal $U_H$ 465. The charge signal $U_{CH}$ 459 is logic high when the voltage of the capacitor $C_{JTR}$ is less than a first threshold reference $V_{REF\_T}$. The discharge signal $U_{DCH}$ 462 is logic low. At time t2 to time t3, the hold signal $U_H$ 465 transitions to a logic low for a hold time $t_H$ 486. The jitter signal $U_{JTR}$ 441 includes a flat or zero slope for a hold time $t_H$ 486. Although the charge signal $U_{CH}$ 459 is a logic high, the hold signal $U_H$ 465 holds charging of the jitter signal $U_{JTR}$ 441. In other words, the hold signal $U_H$ 465 gates the charge signal $U_{CH}$ 459 from propagating. In one example, the charge time $t_{CH}$ 582 and the hold time $t_H$ 486 are not identical. The hold time $t_H$ 486 may vary as the difference between switching period versus the threshold period. The discharge signal $U_{DCH}$ 462 is logic low.

During time t4 to time t5, the jitter generates a jitter signal with a negative slope for a discharge time $t_{DCH}$ 488. The timer circuit generates a logic high signal of hold signal $U_H$ 465. The discharge signal $U_{DCH}$ 462 is a logic high when the voltage $U_{JT}$ 444 of the capacitor $C_{JTR}$ of the jitter generator is greater than a second threshold reference $V_{REF\_B}$. The charge signal $U_{CH}$ 459 is logic low. At time t5 to time t6, the hold signal transitions to a logic low for a hold time $t_H$ 486. In one example, the hold time after a charging time is equivalent to the hold time after a discharging charging time. In another example, the charge and discharge times are equivalent and while the hold times can vary. The jitter signal $U_{JTR}$ 441 is flat with a zero slope during the hold time $t_H$ 486. Although the discharge signal $U_{DCH}$ 462 is a logic high, the hold signal $U_H$ 465 holds charging of the jitter signal $U_{JTR}$ 441. In one example, the discharge time $t_{DCH}$ 488 and the hold time $t_H$ 486 may vary with respect to each other. The charge signal $U_{CH}$ 459 is a logic low.

At time t7 to time t8, the positive slope of the jitter signal $U_{JT}$ 441 is equivalent to what was described during time t1 to time t2. At time t8 to time t9, the flat slope of the jitter signal 441 is equivalent to what was described during time t2 to time t3. At time t10 to time t11, the negative slope of the jitter signal $U_{JTR}$ 441 is equivalent to what was described during time t4 to time t5. At time t11 to time t12, the flat slope of the jitter signal $U_{JTR}$ 441 is equivalent to what was described at time t5 to time t6.

Figure 5:
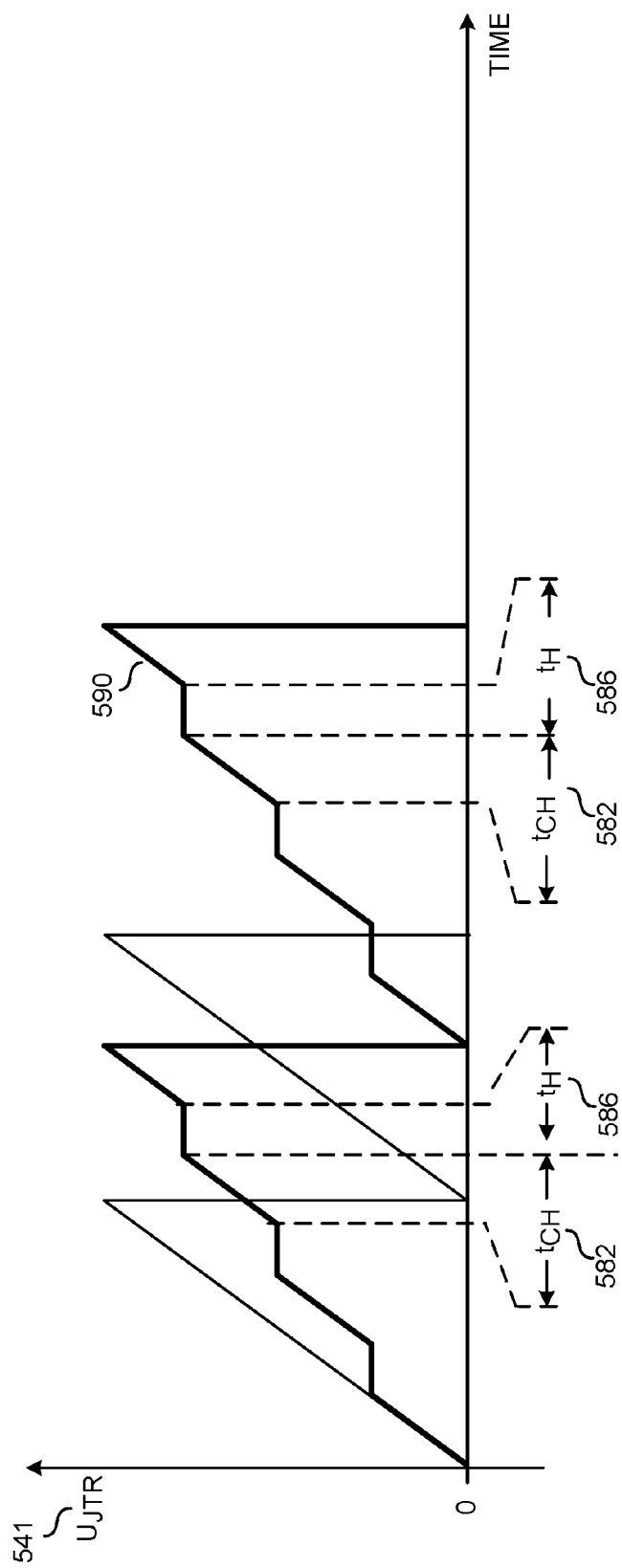
FIG. 5 is an example timing diagram illustrating one example of waveforms that show a jitter signal and a modulated jitter signal in accordance with the teachings of the present invention.

FIG. 5 is another example timing diagram illustrating one example of waveforms that show a jitter signal $U_{JTR}$ 541 and a modulated jitter signal 590 in accordance with the teachings of the present invention. The first timing diagram illustrates a jitter signal $U_{JTR}$ 541. In one example, the jitter signal $U_{JTR}$ 541 waveform is a sawtooth waveform. The first timing diagram further illustrates a modulated jitter signal 590 that is illustrated as a bold waveform. As shown in the depicted example, the modulated jitter signal 590 has the same amplitude as the original jitter signal $U_{JTR}$ 541, but lower frequency as the switching frequency is lowered. The charge time $t_{CH}$ 582 for the jitter signal $U_{JTR}$ 541 is always the same. In general, the charge and discharge times are equivalent and while the hold time can vary. Once the jitter signal $U_{JTR}$ 541 reaches the peak amplitude, the jitter signal drops back to zero.

Figure 6:
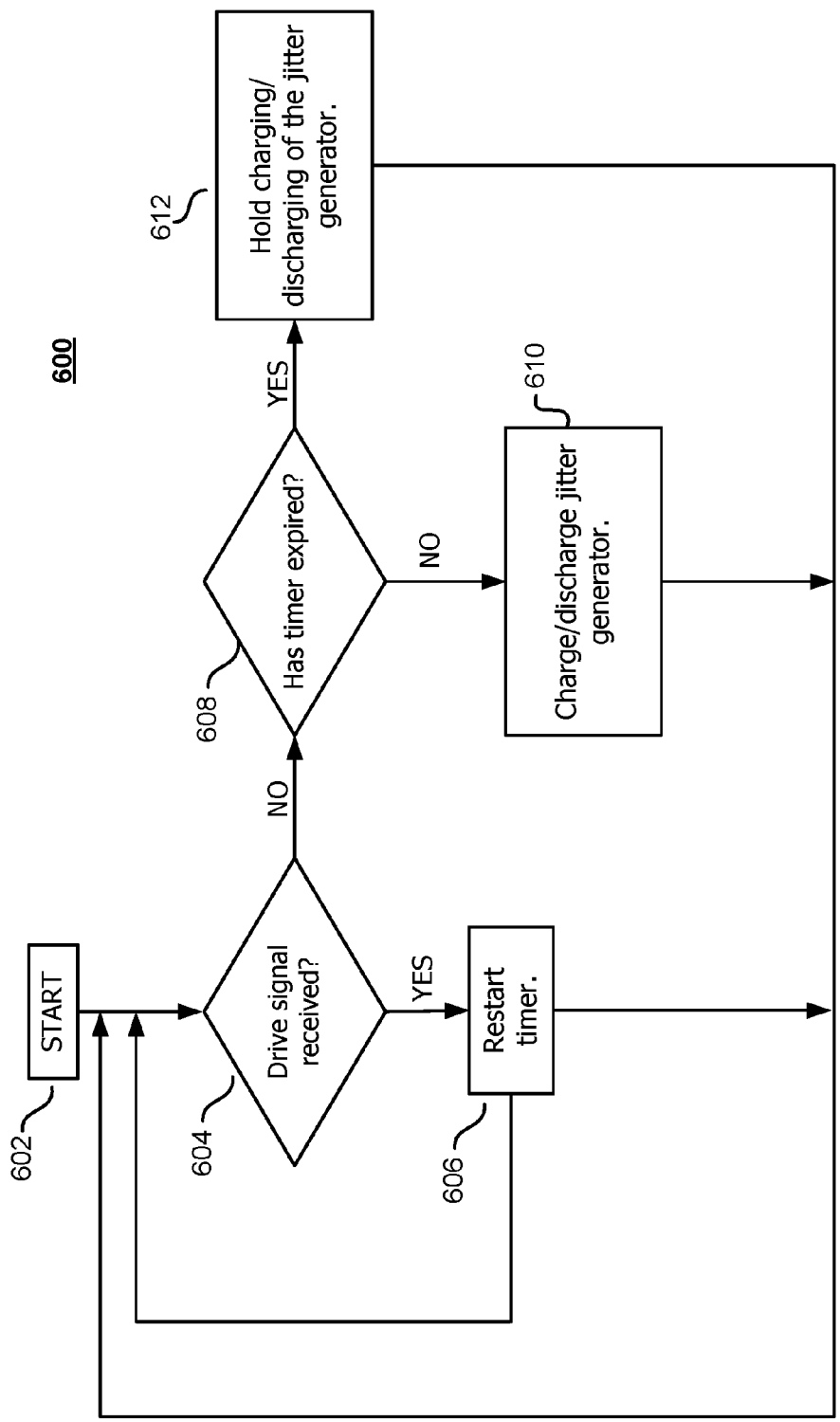
FIG. 6 is a flow diagram illustrating an example process for modulating the jitter frequency, in accordance with an example of the present invention.

FIG. 6 is a flow diagram illustrating an example process for modulating the jitter frequency, in accordance with an example of the present invention. The order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

Process 600 begins at the start block 602 and continues to decision block 604. At decision block 604, a drive signal must be received. If the drive signal is not received, process 600 proceeds to decision block 608. If the drive signal is received, process 600 proceeds to block 606. At block 606, the timer circuit is restarted and enabled. Process 600 loops to decision block 604.

If the drive signal was not received at decision block 604 and process 600 continued to decision block 608 as mentioned previously, the current status of the timer is checked at decision block 608. If the timer is not expired, process 600 proceeds to block 610 and charges or discharges the capacitor of the jitter generator. Process 600 then loops back to decision block 604 then to decision block 608 until the timer expires. Once the timer expires as checked at decision block 608, process 600 proceeds to block 612. At block 612, a hold signal to charge/discharge the capacitor of the jitter generator is enabled. Process 600 then loops back to decision block 604.

Figure 7:
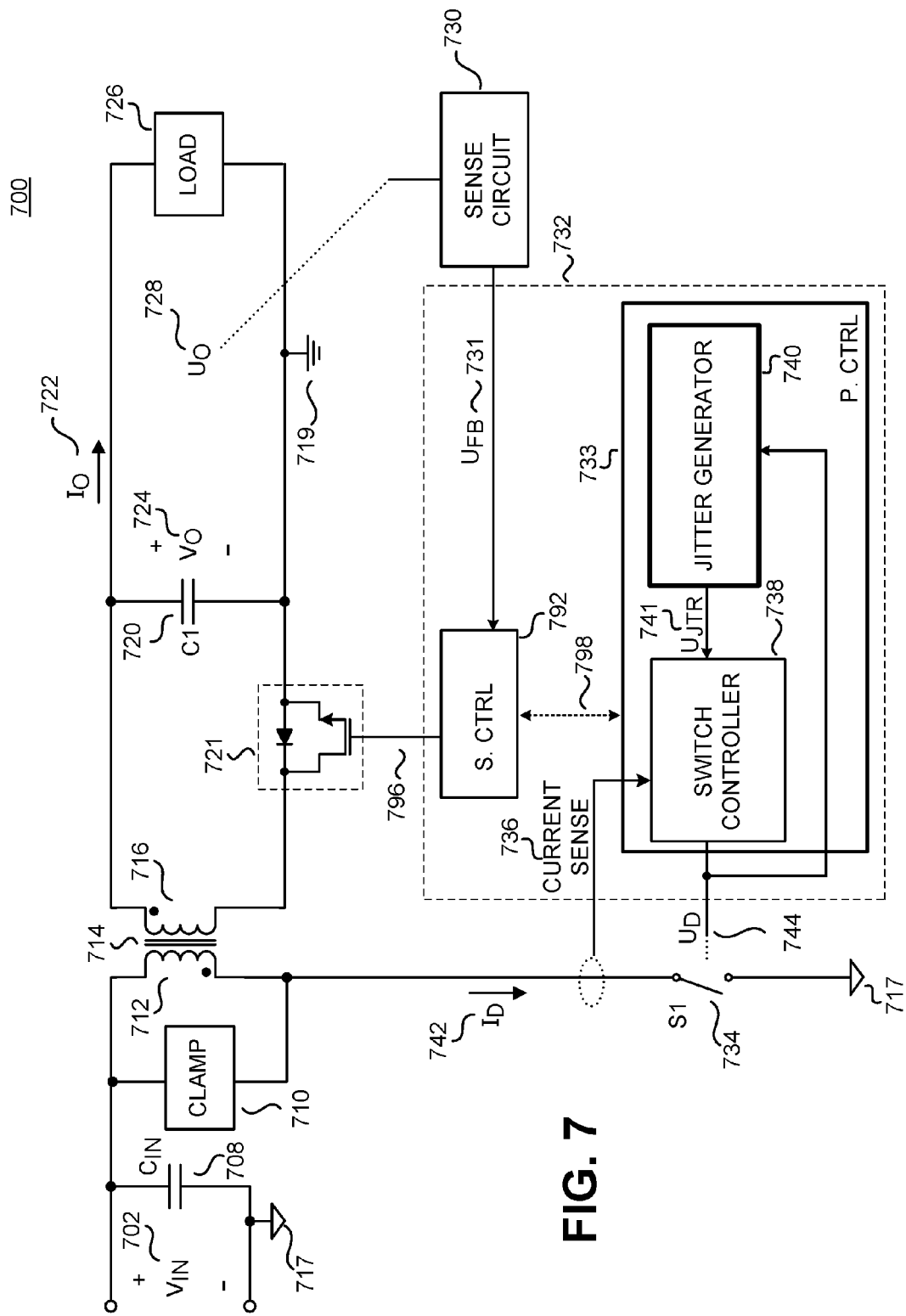
FIG. 7 is a schematic illustrating a power converter with a primary controller that includes a switch controller and a jitter generator and a secondary controller in accordance with the teachings of the present invention.

FIG. 7 is a schematic illustrating a power converter with a primary controller that includes a switch controller and a jitter generator and a secondary controller in accordance with the teachings of the present invention. As shown in the depicted example, power converter 700 further includes an input capacitor $C_{IN}$ 708, a clamp circuit 710, an energy transfer element T1 714, an input return 717, an output return 719, an output capacitor C1 720, an output rectifier 721, a load 726, a sense circuit 730, and a controller 732. Further illustrated in FIG. 7 are the input voltage $V_{IN}$ 702, output voltage $V_O$ 724, output current $I_O$ 722, output quantity $U_O$ 728, and secondary drive signal 796. The output rectifier is a synchronous rectifier circuit 721 comprising a switch that is coupled to rectify the output of the power converter 700.

Controller 732 is further illustrated as including the primary controller 733 and the secondary controller 792 with a communication link 798 between the primary controller 733 and the secondary controller 792. In one example, the primary controller 733 and secondary controller 792 could be formed as a monolithic circuit. As illustrated, the primary controller 733 further includes a jitter generator circuit 740 and a switch controller 738 as shown in the previous figures. The secondary controller 792 is coupled to generate a secondary control signal 796 coupled to be received by the synchronous rectifier circuit 721 to rectify the output of the power converter.

In another example, the jitter generator 740 may be implemented on the secondary controller 792 instead of the primary controller 733 to produce the same effect on the output switching frequency.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A controller for use in a power converter, comprising:
a jitter generator circuit coupled to receive a drive signal from a switch controller and generate a jitter signal; and
the switch controller coupled to a power switch coupled to an energy transfer element, wherein the switch controller is coupled to receive a current sense signal representative of a drain current through the power switch, wherein the switch controller is coupled to generate the drive signal to control switching of the power switch in response to the current sense signal and the jitter signal to control a transfer of energy from an input of the power converter to an output of the power converter.

2. The controller of claim 1, wherein the jitter generator includes a timer circuit coupled to generate a hold signal in response to the drive signal to indicate whether a pulse of the drive signal has been detected at a frequency below a first threshold frequency.

3. The controller of claim 2, wherein the jitter generator circuit includes a capacitor coupled to generate the jitter signal, wherein the capacitor is coupled to be charged by a first current source if the jitter signal is less than a first voltage reference, and wherein the capacitor is coupled to be discharged by a second current source if the jitter signal is greater than a second voltage reference.

4. The controller of claim 3, wherein the hold signal is coupled to cease charging of the capacitor when a pulse of the drive signal has been detected at the frequency below the first threshold frequency.

5. The controller of claim 3, wherein the hold signal is coupled to cease discharging of the capacitor when a pulse of the drive signal has been detected at the frequency below the first threshold frequency.

6. The controller of claim 1, wherein the jitter signal is a triangle waveform.

7. The controller of claim 1, wherein the jitter signal is a sawtooth waveform.

8. The controller of claim 3, wherein the jitter generator circuit comprises:
   a comparator having a first input coupled to one end of the capacitor, and a second input coupled to a voltage reference;
   a first logic gate having a first input coupled to an inverted output of the comparator, and a second input coupled to an output of the timer circuit, wherein the first logic gate is coupled to activate or deactivate a second switch; and
   a second logic gate having a first input coupled to an output of the comparator, and a second input coupled to the output of the timer circuit, wherein the second logic gate is coupled to be activated or deactivate a third switch.

9. The controller of claim 8, wherein a value of the voltage reference is selected in response to the output of the comparator.

10. A power converter, comprising:
    an energy transfer element coupled between an input of the power converter and an output of the power supply;
    a controller, wherein the controller includes:
      a jitter generator circuit coupled to receive a drive signal from a switch controller and generate a jitter signal; and
      the switch controller coupled to a power switch coupled to an energy transfer element, wherein the switch controller is coupled to receive a current sense signal representative of a drain current through the power switch, wherein switch controller is coupled to generate the drive signal to control switching of the power switch.

11. The power converter of claim 10, wherein the jitter generator includes a timer circuit coupled to generate a hold signal in response to the drive signal to indicate whether a pulse of the drive signal has been detected at a frequency below a first threshold frequency.

12. The power converter of claim 11, wherein the jitter generator circuit includes a capacitor coupled to generate the jitter signal, wherein the capacitor is coupled to be charged by a first current source if the jitter signal is less than a first voltage reference, and wherein the capacitor is coupled to be discharged by a second current source if the jitter signal is greater than a second voltage reference.

13. The power converter of claim 12, wherein the hold signal is coupled to cease charging of the capacitor when a pulse of the drive signal has been detected at the frequency below the first threshold frequency.

14. The power converter of claim 12, wherein the hold signal is coupled to cease discharging of the capacitor when a pulse of the drive signal has been detected at the frequency below the first threshold frequency.

15. The power converter of claim 10, wherein the jitter signal is a triangle waveform.

16. The power converter of claim 10, wherein the jitter signal is a sawtooth waveform.

17. The power converter of claim 12, wherein the jitter generator circuit comprises:
    a comparator having a first input coupled to a one end of the capacitor, and a second input coupled to a voltage reference;
    a first logic gate having a first input coupled to an inverted output of the comparator, and a second input coupled to the output of the timer circuit, wherein the first logic gate is coupled to activate or deactivate a second switch; and
    a second logic gate having a first input coupled to an output of the comparator, and a second input coupled to the output of the timer circuit, wherein the second logic gate is coupled to be activated or deactivate a third switch.

18. The power converter of claim 17, wherein a value of the voltage reference is selected in response to the output of the comparator.

19. The power converter of claim 10, further comprising a rectifier coupled to the output of the power supply to rectify the output of the power supply.

20. The power converter of claim 19, wherein the rectifier comprises a diode.

21. The power converter of claim 19, wherein the rectifier is a synchronous rectifier circuit comprising a switch coupled to rectify an output of the power converter.

22. The power converter of claim 21, further comprising a secondary controller coupled to generate a secondary control signal coupled to be received by the synchronous rectifier circuit to rectify the output of the power converter in response to a feedback signal.

* * * * *